United States Patent
Ishida et al.

(10) Patent No.: US 6,791,409 B2
(45) Date of Patent: Sep. 14, 2004

(54) FEEDFORWARD AMPLIFIER AND FEEDFORWARD AMPLIFICATION METHOD

(75) Inventors: Kaoru Ishida, Shijonawate (JP); Naoki Takachi, Yokohama (JP); Rie Takeuchi, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/198,251

(22) Filed: Jul. 18, 2002

(65) Prior Publication Data

US 2003/0020541 A1 Jan. 30, 2003

(30) Foreign Application Priority Data

Jul. 18, 2001 (JP) ..................................... 2001-218419

(51) Int. Cl.[7] ............................................. H03F 1/26
(52) U.S. Cl. ..................................... 330/151; 330/149
(58) Field of Search ............................. 330/149, 150, 330/151, 157, 103, 52, 98

(56) References Cited

U.S. PATENT DOCUMENTS

| | | | | |
|---|---|---|---|---|
| 6,172,560 B1 | * | 1/2001 | Yamashita et al. | 330/52 |
| 6,313,702 B1 | * | 11/2001 | Seino | 330/149 |
| 6,489,844 B2 | * | 12/2002 | Yamashita et al. | 330/52 |

FOREIGN PATENT DOCUMENTS

| | | |
|---|---|---|
| EP | 0996225 | 4/2000 |
| JP | 2000-196366 | 1/2002 |

OTHER PUBLICATIONS

John L. B. Walker, "High–Power GaAs FET Amplifiers", Artech House, 1993, pp. 332–333.

Tero Ojanpera et al, "Wideband CDMA For Third Generation Mobile Communications", Artech House, 1998, pp. 58 to 62.

* cited by examiner

Primary Examiner—Linh M. Nguyen
(74) Attorney, Agent, or Firm—RatnerPrestia (57) ABSTRACT

(Object)

It was difficult for a feedforward amplifier to perform stable and high-speed distortion compensation control.

(Constitution)

It is a feedforward amplifier having CPL1 of dividing an input carrier signal into two output signals, VAP1 of adjusting one of the two divided output signals, AMP1 of amplifying the adjusted one of the output signals to generate an amplification signal, CPL2 of extracting a distortion signal by utilizing the other output signal of the two divided output signals and the generated amplification signal, CPL3 of generating an output carrier signal by utilizing the generated amplification signal and the extracted distortion signal, and CNT1 having a log amplifier of controlling VAP1 based on the other output signal and the generated amplification signal.

16 Claims, 5 Drawing Sheets

FEEDFORWARD AMPLIFIER AND FEEDFORWARD AMPLIFICATION METHOD

BACKGROUND OF THE INVENTION

1. Field of the Invention

The present invention relates to a feedforward amplifier and a feedforward amplification method used for mobile communication base station equipment and so on.

2. Related Art of the Invention

In recent years, a power amplifier of high efficiency and high linearity is required for a transmitter of a mobile communication base station in order to amplify a large number of signaling channels by one operation, and improvement in the linearity is implemented by performing distortion compensation by a feedforward method. Moreover, a feedforward amplifier will not be described in detail here since it is also described in John L. B. Walker, "High-Power GaAs FET Amplifiers," Artech House, 1993, pp. 332 to 333 and so on, for instance.

And in recent years, a CDMA (Code Division Multiple Access) method is adopted as a modulation method of a portable telephone, so that the base station requires switching of output power such as high-speed power control and burst transmission, and high-speed distortion compensation control is also required for feedforward distortion compensation. Moreover, the CDMA method will not be described in detail here since it is also described in Tero Ojanpera et al., "Wideband CDMA For Third Generation Mobile Communications," Artech House, 1998, pp. 58 to 62 and so on, for instance.

Here, configuration of a feedforward amplifier in the past will be described by referring to FIG. 5 which is a block diagram thereof (for instance, a feedforward nonlinear distortion compensation amplifier described in Japanese Patent Laid-Open No. 2000-196366).

Figure 5:
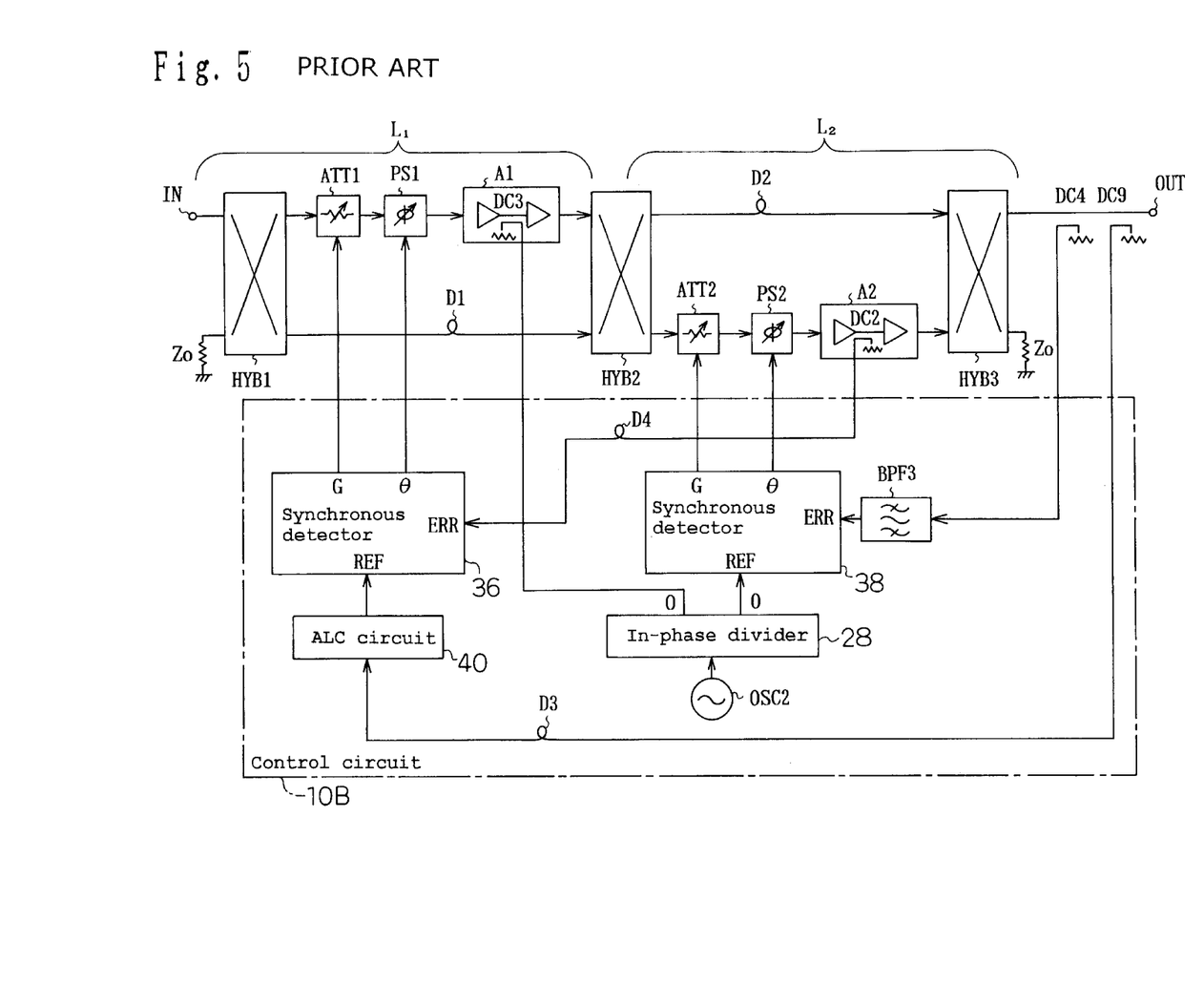
FIG. 5 is a block diagram of the feedforward amplifier of the past.

In FIG. 5, reference character IN represents an input terminal, Zo represents a terminating resistor, HYB1 represents a first hybrid, ATT1 represents a first variable attenuator, PS1 represents a first variable phase shifter, A1 represents a main amplifier, D1 represents a first delay element, HYB2 represents a second hybrid, D2 represents a second delay element, ATT2 represents a second variable attenuator, PS2 represents a second variable phase shifter, A2 represents an error amplifier, HYB3 represents a third hybrid, DC3 represents a first coupler, DC2 represents a second coupler, DC4 represents a third coupler, DC9 represents a fourth coupler, D3 represents a third delay element, D4 represents a fourth delay element, BPF3 represents a band pass filter, OSC2 represents a local oscillator, reference numeral 28 denotes an in-phase divider, 36 denotes a first synchronous detector, 38 denotes a second synchronous detector, and 40 denotes an ALC (auto level control) circuit.

Next, operation of the feedforward amplifier in the past will be described.

As for distortion cancellation loop (L2) control, a pilot signal generated by the local oscillator OSC2 is divided by the in-phase power divider 28, and one of the divided pilot signal is injected from the first coupler DC3 to the main amplifier A1. In addition, a suppressed signal of a distortion cancellation loop is taken out of the third coupler DC4 and is added to the second synchronous detector 38 together with the other output of the in-phase divider 28 via the band pass filter BPF3 so as to acquire an amplitude error and a phase error. And the errors thus acquired are added to a control terminal of the second variable attenuator ATT2 and that of the second variable phase shifter PS2 so as to exert control.

As for distortion detection loop (L1) control, a transmitting carrier taken out of the fourth coupler DC9 as a combined output is added to the synchronous detector 36 via the third delay element D3 and the auto level control circuit 40, and the blocked signal of a distortion detection loop taken out of the second coupler DC2 as a combined output is added to the synchronous detector 36 via the fourth delay element D4. And the amplitude error and the phase error are outputted therefrom, and the outputted errors are added to the control terminal of the first variable attenuator ATT1 and that of the first variable phase shifter PS1 so as to exert control.

When the carrier level goes down in such a configuration, distortion detection loop control is stabilized by keeping a level of a reference transmitting carrier constant. For this reason, the auto level control circuit 40 was essential in order to cope with the cases where an output level is significantly changed by a method of a wide dynamic range.

As for such an auto level control circuit, however, an accuracy of distortion compensation is apt to be influenced by a temperature change and so on, and so it may be difficult to obtain stable distortion compensation.

In addition, in the case of performing the burst transmission, there was a limit to speedup of the control since it takes time before the level of the transmitting carrier becomes constant due to use of a feedback circuit as the auto level control circuit.

SUMMARY OF THE INVENTION

An object of the present invention is, in consideration of the above problems in the past, to provide the feedforward amplifier and the feedforward amplification method capable of performing high-speed distortion compensation control without using the auto level control circuit.

One aspect of the present invention is a feedforward amplifier comprising:

a first coupler of dividing an input signal into two outputs;

a first vector adjuster connected to one of the outputs of said first coupler, of adjusting an amplitude and a phase of a passing signal;

a main amplifier connected to the output of said first vector adjuster;

a first delay element connected to the other output of said first coupler;

a second coupler connected to the output of said main amplifier and the output of said first delay element, of outputting the output of said main amplifier as it is as a first output and outputting as a second output a component in which the output of said main amplifier and the output of said first delay element are combined in an opposite phase;

a second delay element connected to the first output of said second coupler;

a second vector adjuster connected to the second output of said second coupler, of adjusting the amplitude and the phase of the passing signal;

an error amplifier connected to the output of said second vector adjuster;

a third coupler connected to the output of said second delay element and the output of said error amplifier, of outputting a component in which the output of said second delay element and the output of said error amplifier are combined in the opposite phase;

a fourth coupler inserted into at least one location between the output of said first vector adjuster and the output of said main amplifier;

a fifth coupler inserted between the output of said main amplifier and said second coupler;

a sixth coupler inserted between the second output of said second coupler and the input of said second vector adjuster;

a seventh coupler connected to the output of said third coupler;

a distortion cancellation loop control circuit of dividing in two the output of at least one predetermined local oscillator, connecting one of the outputs to a combined input of said fourth coupler, inputting the other output and a combined output of said seventh coupler, and comparing an output signal of said at least one local oscillator to a combined output signal of said seventh coupler to acquire an error in the amplitude and an error in the phase so as to provide a control voltage to two control terminals of said second vector adjuster;

an in-phase power dividing circuit connected to the combined output of said fifth coupler;

a 90-degree power dividing circuit connected to the combined output of said sixth coupler;

a first log amplifier connected to one of the outputs of said in-phase power dividing circuit;

a second log amplifier connected to one of the outputs of said 90-degree power dividing circuit;

a first mixer connected to the output of said first log amplifier and the output of said second log amplifier;

a subtraction circuit connected to the output of said first log amplifier and the output of said second log amplifier;

an inversion circuit connected to the output of said subtraction circuit;

a switching circuit of having the output of said subtraction circuit and the output of said inversion circuit inputted therein and outputting one of them;

a second mixer connected to the other output of said in-phase power dividing circuit and the other output of said 90-degree power dividing circuit; and a comparator connected to the output of said second mixer, and wherein:

the two outputs of said distortion cancellation loop control circuit are connected to the two control terminals of said second vector adjuster;

the output of said comparator is connected to a switching control terminal of said switching circuit;

the output of said first mixer and the output of said switching circuit are connected to the two control terminals of said first vector adjuster directly or via at least one predetermined level changing means; and (1) as for the output of said second mixer, inversion and non-inversion of the output of said subtraction circuit are switched by using said switching circuit to be rendered as the error in said amplitude according to a phase comparison output between a combined output signal of said fifth coupler and a combined output signal of said sixth coupler and an output result of said comparator; and (2) the output of said first mixer is rendered as the error in said phase, and the control voltage is provided to the two control terminals of said first vector adjuster based on the error in the amplitude and the error in the phase.

Another aspect of the present invention is the feedforward amplifier, wherein said in-phase power dividing circuit is connected to the output of said first log amplifier and said 90-degree power dividing circuit is connected to the output of said second log amplifier.

Still another aspect of the present invention a feedforward amplifier comprising:

a first coupler of dividing an input signal into two outputs;

a first vector adjuster connected to one of the outputs of said first coupler, of adjusting an amplitude and a phase of a passing signal;

a main amplifier connected to the output of said first vector adjuster;

a first delay element connected to the other output of said first coupler;

a second coupler connected to the output of said main amplifier and the output of said first delay element, of outputting the output of said main amplifier as it is as a first output and outputting as a second output a component in which the output of said main amplifier and the output of said first delay element are combined in an opposite phase;

a second delay element connected to the first output of said second coupler;

a second vector adjuster connected to the second output of said second coupler, of adjusting the amplitude and the phase of the passing signal;

an error amplifier connected to the output of said second vector adjuster;

a third coupler connected to the output of said second delay element and the output of said error amplifier, of outputting a component in which the output of said second delay element and the output of said error amplifier are combined in the opposite phase;

a fourth coupler inserted into at least one location between the output of said first vector adjuster and the output of said main amplifier;

a fifth coupler inserted between the output of said main amplifier and said second coupler;

a sixth coupler inserted between the second output of said second coupler and the input of said second vector adjuster;

a seventh coupler connected to the output of said third coupler;

a distortion cancellation loop control circuit of dividing in two the output of at least one predetermined local oscillator, connecting one of the outputs to a combined input of said fourth coupler, inputting the other output and a combined output of said seventh coupler, and comparing an output signal of said at least one local oscillator to a combined output signal of said seventh coupler to acquire an error in the amplitude and an error in the phase so as to provide a control voltage to two control terminals of said second vector adjuster;

an in-phase power dividing circuit connected to the combined output of said fifth coupler;

a 90-degree power dividing circuit connected to the combined output of said sixth coupler;

a first log amplifier connected to one of the outputs of said in-phase power dividing circuit;

a second log amplifier connected to one of the outputs of said 90-degree power dividing circuit;

a first mixer connected to the output of said first log amplifier and the output of said second log amplifier;

a third log amplifier connected to the other output of said in-phase power dividing circuit;

a fourth log amplifier connected to the other output of said 90-degree power dividing circuit; and a second mixer connected to the output of said third log amplifier and the output of said fourth log amplifier, and wherein:

the two outputs of said distortion cancellation loop control circuit are connected to the two control terminals of said second vector adjuster;

the output of said first mixer and the output of said second mixer are connected to the two control terminals of said first vector adjuster directly or via at least one predetermined level changing means; and (1) the output of said first mixer is rendered as the error in said phase; and (2) the output of said second mixer is rendered as the error in said amplitude, and the control voltage is provided to the two control terminals of said first vector adjuster based on the error in the amplitude and the error in the phase.

Yet still another aspect of the present invention is the feedforward amplifier, wherein said in-phase power dividing circuit is connected to the output of said first log amplifier and said 90-degree power dividing circuit is connected to the output of said second log amplifier;

said first mixer is connected to one of the outputs of said in-phase power dividing circuit and one of the outputs of said 90-degree power dividing circuit;

said second mixer is connected to the other output of said in-phase power dividing circuit and the other output of said 90-degree power dividing circuit; and said third and fourth log amplifiers are omitted.

Still yet another aspect of the present invention is the feedforward amplifier, wherein said fifth coupler is inserted between the output of said first delay element and said second coupler or between the output of said first coupler and the input of said first delay element.

A further aspect of the present invention is the feedforward amplifier, wherein said fifth coupler is inserted at the inputs of said main amplifier or between the stages of said main amplifier.

A still further aspect of the present invention is the feedforward amplifier, wherein said fifth coupler is inserted (1) between the output of said second coupler and the input of said second delay element, (2) between the stages of said second delay element, or (3) between the output of said second delay element and the input of said third coupler.

A yet further aspect of the present invention is the feedforward amplifier, wherein said fifth coupler is inserted behind the output of said third coupler or between the combined output of said seventh coupler and the input of said distortion cancellation loop control circuit.

A still yet further aspect of the present invention is the feedforward amplifier, wherein at least one of the amplifier or attenuator is inserted between the second output of said second coupler and the input of said sixth coupler.

An additional aspect of the present invention is the feedforward amplifier, wherein said first to fourth log amplifiers are limiter amplifiers.

A still additional aspect of the present invention is the feedforward amplifier, wherein at least two of said first to fourth log amplifiers, said first and second mixers, said subtraction circuit, said comparator, said inversion circuit, said switching circuit, said in-phase power dividing circuit and said 90-degree power dividing circuit are integrated in the same semiconductor substrate.

A yet additional aspect of the present invention is the feedforward amplifier, comprising:

a distortion detection loop control circuit of inputting the combined output of said fifth coupler and the combined output of said sixth coupler, and outputting the control voltage to a phase control terminal and an amplitude control terminal of said first vector adjuster respectively;

an eighth coupler inserted between the combined output of said fifth coupler and one of the inputs of said distortion detection loop control circuit;

a power detection circuit connected to the combined output of said eighth coupler;

a second comparator connected to a detection output of said power detection circuit;

a second switching circuit of connecting a common terminal to the phase control terminal of said first vector adjuster and connecting to a switching terminal one of the outputs of said distortion detection loop control circuit and the output of a first reference voltage generation circuit of generating a first reference voltage;

a third switching circuit of connecting the common terminal to the amplitude control terminal of said first vector adjuster and connecting to the switching terminal the other output of said distortion detection loop control circuit and the output of a second reference voltage generation circuit of generating a second reference voltage, wherein:

according to the output of said second comparator, said second switching circuit switches between one of the outputs of said distortion detection loop control circuit and the output of said first reference voltage generation circuit; and said third switching circuit switches between the other output of said distortion detection loop control circuit and the output of said second reference voltage generation circuit.

A still yet additional aspect of the present invention is the feedforward amplifier, wherein the output of said power detection circuit is utilized as an output power monitor.

A supplementary aspect of the present invention is a feedforward amplifier comprising:

input carrier signal dividing means of dividing an input carrier signal into two output signals;

adjusting means of adjusting one of said two divided output signals;

amplifying means of amplifying said adjusted one of the output signals to generate an amplification signal;

distortion signal extracting means of extracting a distortion signal by utilizing the other output signal of said two divided output signals and said generated amplification signal;

output signal generating means of generating an output carrier signal by utilizing said generated amplification signal and said extracted distortion signal; and control means having at least one log amplifier of controlling said adjusting means based on said other output signal and said generated amplification signal.

A still supplementary aspect of the present invention is the feedforward amplifier, having delaying means of delaying said other output signal, wherein said log amplifier is utilized to control said adjusting means by (1) detecting a phase error as a deviation from an opposite phase of a difference between the phase of said delayed other output signal and the phase of said generated amplification signal, and (2) detecting an amplitude error as a deviation between the amplitude of said delayed other output signal and the amplitude of said generated amplification signal, so that said detected phase error and said detected amplitude error become zero.

A yet supplementary aspect of the present invention is a feedforward amplifying method comprising:

an input carrier signal dividing step of dividing an input carrier signal into two output signals;

an adjusting step of adjusting one of said two divided output signals;

an amplifying step of amplifying said adjusted one of the output signals to generate an amplification signal;

a distortion signal extracting step of extracting a distortion signal by utilizing the other output signal of said two divided output signals and said generated amplification signal;

an output signal generating step of utilizing said generated amplification signal and said extracted distortion signal to generate an output carrier signal; and a control step of controlling said adjusting by utilizing a log amplifier based on said other output signal and said generated amplification signal.

Description of Symbols

IN Input terminal
CPL1 First coupler
VAP1 First vector adjuster
AMP1 Main amplifier
DLY1 First delay element
CPL2 Second coupler
DLY2 Second delay element
VAP2 Second vector adjuster
AMP2 Error amplifier
CPL3 Third coupler
CPL4 Fourth coupler
CPL5 Fifth coupler
CPL6 Sixth coupler
CPL7 Seventh coupler
SPL1 In-phase power divider
HYB1 90-degree power divider
LOG1 First log amplifier
LOG2 Second log amplifier
MIX1 First mixer
MIX2 Second mixer
DIF1 Subtraction circuit
INV1 Inversion circuit
SW1 Switching circuit
CMP1 Comparator
CNT1 Distortion detection loop control circuit comprised of SPL1 to CMP1
OSC1 Local oscillator
CNT2 Distortion cancellation loop control circuit
OUT Output terminal

PREFERRED EMBODIMENTS OF THE INVENTION

Hereafter, embodiments related to the present invention will be described by referring to the drawings.

(Embodiment 1)

First, configuration of a feedforward amplifier of Embodiment 1 of the present invention will be described by referring to FIG. 1 which is a block diagram thereof.

Figure 1:
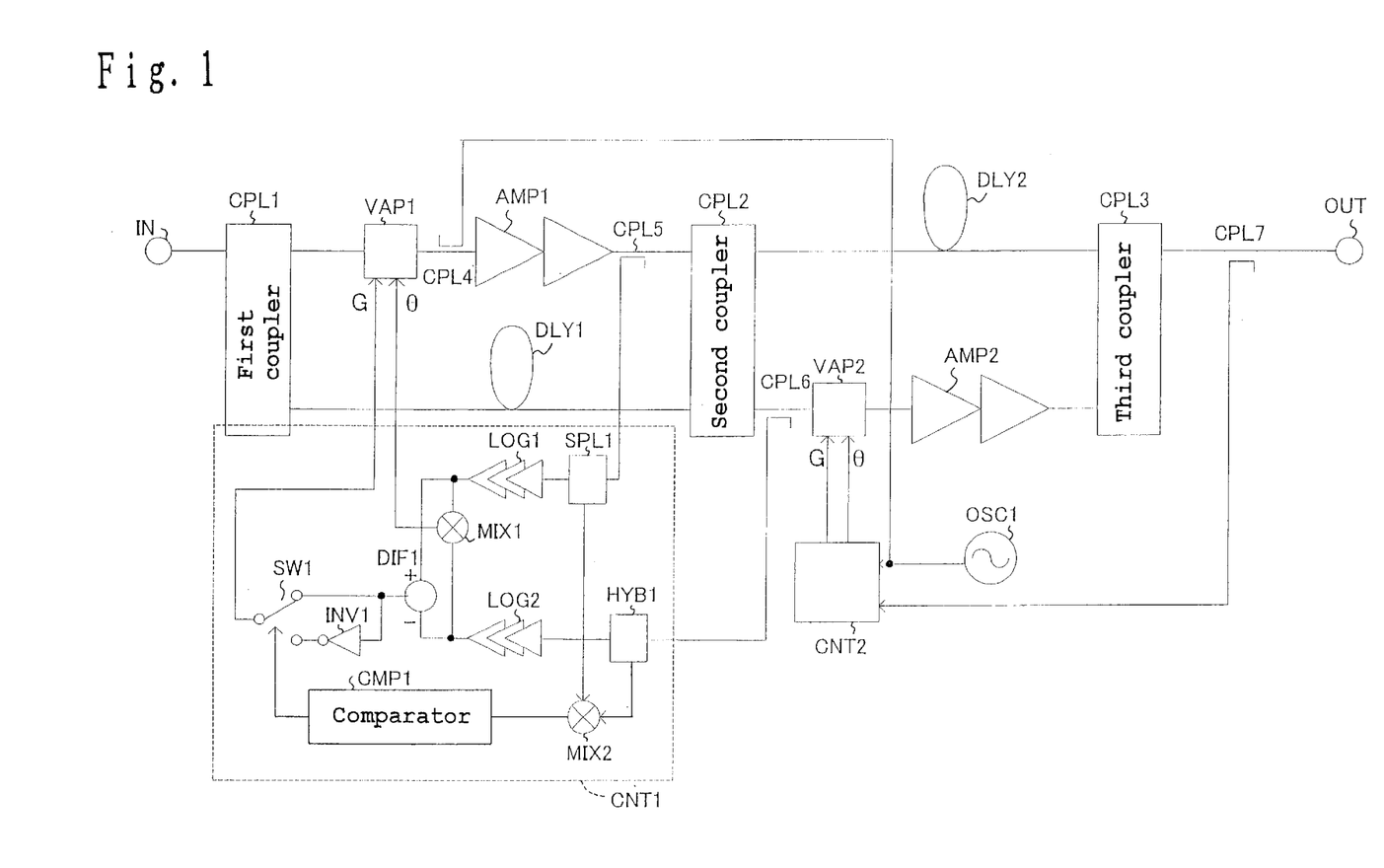
FIG. 1 is a block diagram of a feedforward amplifier of Embodiment 1 of the present invention.

In FIG. 1, reference character IN represents an input terminal, CPL1 represents a first coupler, VAP1 represents a first vector adjuster, AMP1 represents a main amplifier, DLY1 represents a first delay element, CPL2 represents a second coupler, DLY2 represents a second delay element, VAP2 represents a second vector adjuster, AMP2 represents an error amplifier, CPL3 represents a third coupler, CPL4 represents a fourth coupler, CPL5 represents a fifth coupler, CPL6 represents a sixth coupler, CPL7 represents a seventh coupler, SPL1 represents an in-phase power divider (in-phase power dividing circuit), HYB1 represents a 90-degree power divider(90-degree power dividing circuit), LOG1 represents a first log amplifier, LOG2 represents a second log amplifier, MIX1 represents a first mixer, MIX2 represents a second mixer, DIF1 represents a subtraction circuit, INV1 represents an inversion circuit, SW1 represents a switching circuit, CMP1 represents a comparator, CNT1 represents a distortion detection loop control circuit comprised of SPL1 to CMP1, OSC1 represents a local oscillator, CNT2 represents a distortion cancellation loop control circuit, and OUT represents an output terminal.

Moreover, CPL1 corresponds to input carrier signal dividing means of the present invention, VAP1 corresponds to adjusting means of the present invention, AMP1 corresponds to amplifying means of the present invention, CPL2 corresponds to distortion signal extracting means of the present invention, CPL3 corresponds to output signal generating means of the present invention, and CNT1 corresponds to control means of the present invention. In addition, DLY1 corresponds to delaying means of the present invention.

Next, operation of the feedforward amplifier of Embodiment 1 of the present invention will be described. Moreover, an embodiment of a feedforward amplification method of the present invention will also be described while describing the operation of the feedforward amplifier of this embodiment (the embodiments hereafter will also be described likewise).

The distortion cancellation loop control circuit CNT2 inputs and divides a pilot signal outputted from the local oscillator OSC1 which is a local oscillator of generating the pilot signals, and injects the remaining divided pilot signal into an input of the main amplifier AMP1, and then takes the pilot signal suppressed by a distortion cancellation loop out of the seventh coupler CPL7 and inputs it.

And a distortion cancellation loop control circuit CNT2 outputs an amplitude error and a phase error of the error amplifier AMP2 and the second delay element DLY2 from a difference in characteristics of the two pilot signals, and feeds back these errors to the second vector adjuster VAP2 and exerts control so as to maintain a distortion suppressing characteristic of the distortion cancellation loop.

As opposed to this, the distortion detection loop control circuit CNT1 uses a transmitting carrier taken out of the fifth coupler CPL5 (mainly a carrier signal amplified by the main amplifier AMP1) and a transmitting carrier suppressed by a distortion detection loop taken out of the sixth coupler CPL6 (mainly a distortion signal generated when performing amplification by the main amplifier AMP1).

The transmitting carrier taken out of the fifth coupler CPL5 is divided in the same phase by the in-phase power divider SPL1. The suppressed transmitting carrier taken out of the sixth coupler CPL6 is divided with a phase difference of 90 degrees by the 90-degree power divider HYB1.

One of the outputs of the in-phase power divider SPL1 is amplified by the first log amplifier LOG1, and one of the outputs of the 90-degree power divider HYB1 is amplified by the second log amplifier LOG2, and then the respective outputs are inputted to the first mixer MIX1 so as to obtain a phase error output. In addition, it is possible to obtain an absolute value of an amplitude error output by inputting each output to the subtraction circuit DIF1 (detection of a sign thereof will be described later).

Here, such operation of feedforward distortion compensation will be described further in detail by referring to FIG. 2 which is an explanatory drawing of explaining the operation of feedforward distortion compensation of Embodiment 1 of the present invention.

Figure 2:
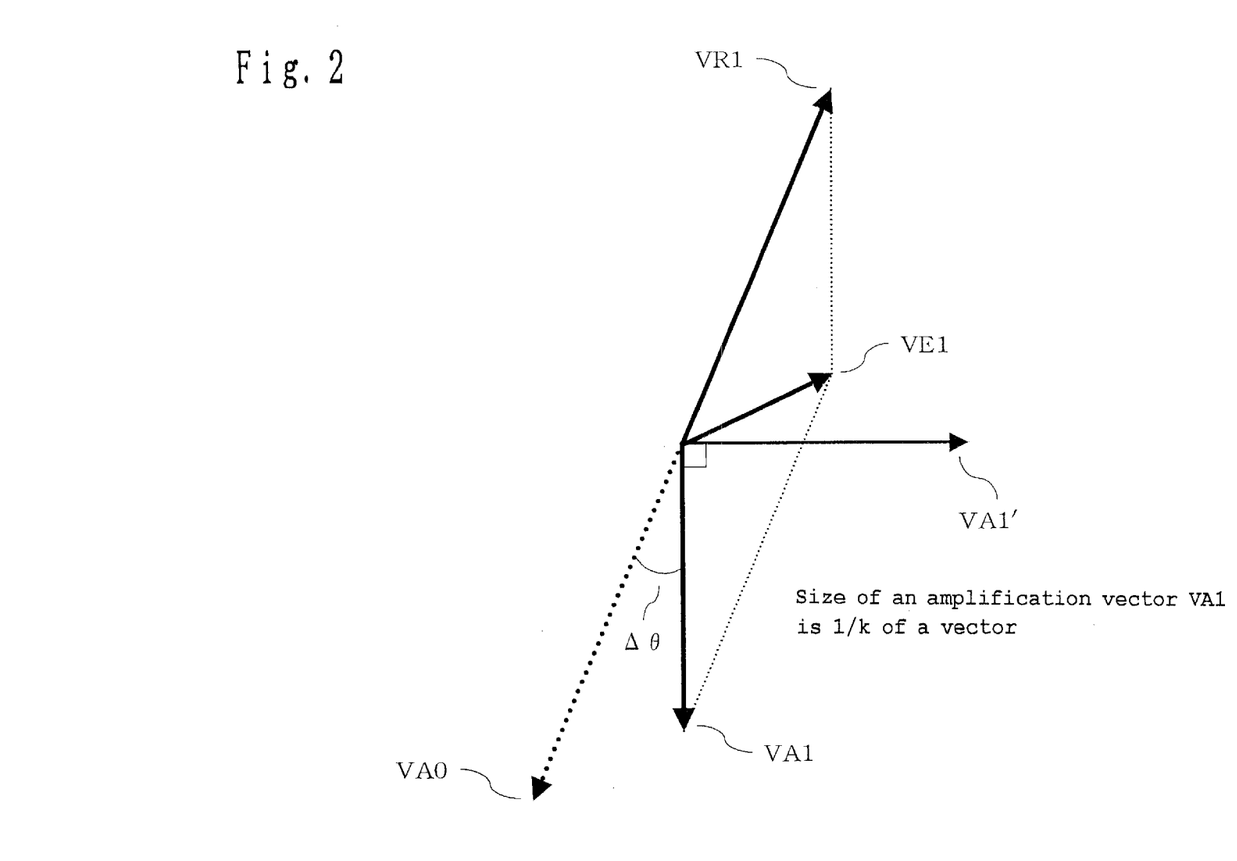
FIG. 2 is an explanatory drawing of explaining operation of feedforward distortion compensation of Embodiment 1 of the present invention.

In FIG. 2, VA1 is an amplification vector to be taken out of CPL5 (refer to FIG. 1) after passing on the amplifier AMP1 (refer to FIG. 1) side of the distortion detection loop, and VR1 is a reference signal vector to be combined with VA1 on CPL2 (refer to FIG. 1) after passing on the delay element DLY1 (refer to FIG. 1) side of the distortion detection loop, and VE1 is an error vector to be taken out of CPL6 (refer to FIG. 1) as a sum of the amplification vector VA1 and the reference signal vector VR1.

Here, it is most ideal that the amplification vector VA1 perfectly matches with a vector VA0 (refer to FIG. 2) having the same size as the reference signal vector VR1 and a phase difference of 180 degrees. It is because the error vector VE1 is suppressed to perfectly become zero in such a case.

In reality, however, there are the cases where the size of the amplification vector VA1 becomes 1/k that of the aforementioned vector VA0 and so an amplitude error ERA (scalar, 1−k hereafter corresponds to this amount) occurs, or the phase of the amplification vector VA1 delays from the phase of the vector VA0 by $\Delta\theta$ and so a phase error ERP (scalar, $\Delta\theta$ hereafter corresponds to this amount) occurs, so that perfect suppression is not performed and the error vector VE1 ($\neq 0$) is generated as a response of a suppression loop (refer to [Equation 6] described later).

To be more specific, the error vector VE1 is represented as follows by using the reference signal vector VR1 and the amplification vector VA1.

$$VE1 = VA1 + VR1 \qquad \text{[Equation 1]}$$

Here, the reference signal vector VR1 is represented as follows by using a normal vector VA1' of the amplification vector VA1.

$$VR1 = (-k \cdot \cos\Delta\theta)VA1 + (k \cdot \sin\Delta\theta)VA1' \qquad \text{[Equation 2]}$$

And so [Equation 1] can be transformed as follows.

$$VE1 = (1 - k \cdot \cos\Delta\theta)VA1 + (k \cdot \sin\Delta\theta)VA1' \qquad \text{[Equation 3]}$$

When the loop is actually controlled, since $$1-k \approx 0,\ \Delta\theta \approx 0 \qquad \text{[Equation 4]}$$

and hence $$\cos\Delta\theta \approx 1,\ \sin\Delta\theta \approx \Delta\theta,$$

[Equation 3] can be transformed as follows by using these approximate expressions.

$$VE1 = (1-k)VA1 + (\Delta\theta)VA1' \qquad \text{[Equation 6]}$$

The feedforward amplifier according to this embodiment has the amplification vector VA1 which is the output of the first log amplifier LOG1 (refer to FIG. 1) and the error vector VE1 which is the output of the second log amplifier LOG2 (refer to FIG. 1) inputted to the mixer MIX1 (refer to FIG. 1) , so that the normal vector VA1' of the amplification vector VA1 and the error vector VE1 are synchronously mixed. And the output of the mixer MIX1 is a phase error voltage output proportional to $\Delta\theta$ (in short, it is a phase error ERP) which appears as a coefficient of a second term of the [Equation 6].

In addition, the output of the subtraction circuit DIF1 (refer to FIG. 1) is an amplitude error voltage proportional to the following.

$$\log\{(1-k)^2 + (\Delta\theta)^2\} \qquad \text{[Equation 7]}$$

Moreover, as it cannot be determined from [Equation 7] whether 1−k (in short, it is an amplitude error ERA) which appears as a coefficient of a first term of the [Equation 6] is positive or negative, the output proportional to 1−k (having the same sign as 1−k accordingly) is obtained by inputting to the mixer MIX2 (refer to FIG. 1) the other output of the in-phase power divider SPL1 (refer to FIG. 1) and the other output of the 90-degree power divider HYB1 (refer to FIG. 1)

Thus, depending on whether or not positive/negative of the aforementioned 1−k is acquired through the inversion circuit INV1 (refer to FIG. 1) by switching the switching circuit SW1 (refer to FIG. 1) through an adequate comparator CMP1 (refer to FIG. 1), an amplitude error voltage output of which sign is correctly considered can be obtained.

Accordingly, it is possible to exert control so that the amplitude error ERA (1−k) and the phase error ERP ($\Delta\theta$) are detected from the obtained phase error voltage output and amplitude error voltage output and the error vector VE1 is rendered zero (to be more specific, $1-k=\Delta\theta=0$).

Thus, this embodiment uses the log amplifier to expand a working range of the mixer so as to allow distortion detection loop control to be performed at high speed via no logical circuit and without using the auto level control circuit including unstableness such as the temperature characteristic.

Moreover, it is obvious that the same effect can be obtained by putting a level converting circuit, to suit a dynamic range of an input voltage of the first vector adjuster, between the phase error output and a phase control voltage terminal of the vector adjuster and between the amplitude error output and an amplitude control voltage terminal of the vector adjuster.

In addition, it is obvious that while this embodiment has the in-phase power divider SPL1 and the 90-degree power divider HYB1 placed before the log amplifier, the same effect can be obtained by placing the in-phase divider and the 90-degree power divider on the output side of the log amplifier.

(Embodiment 2)

Next, the configuration of the feedforward amplifier of Embodiment 2 of the present invention will be described by referring to FIG. 3 which is a block diagram thereof.

Figure 3:
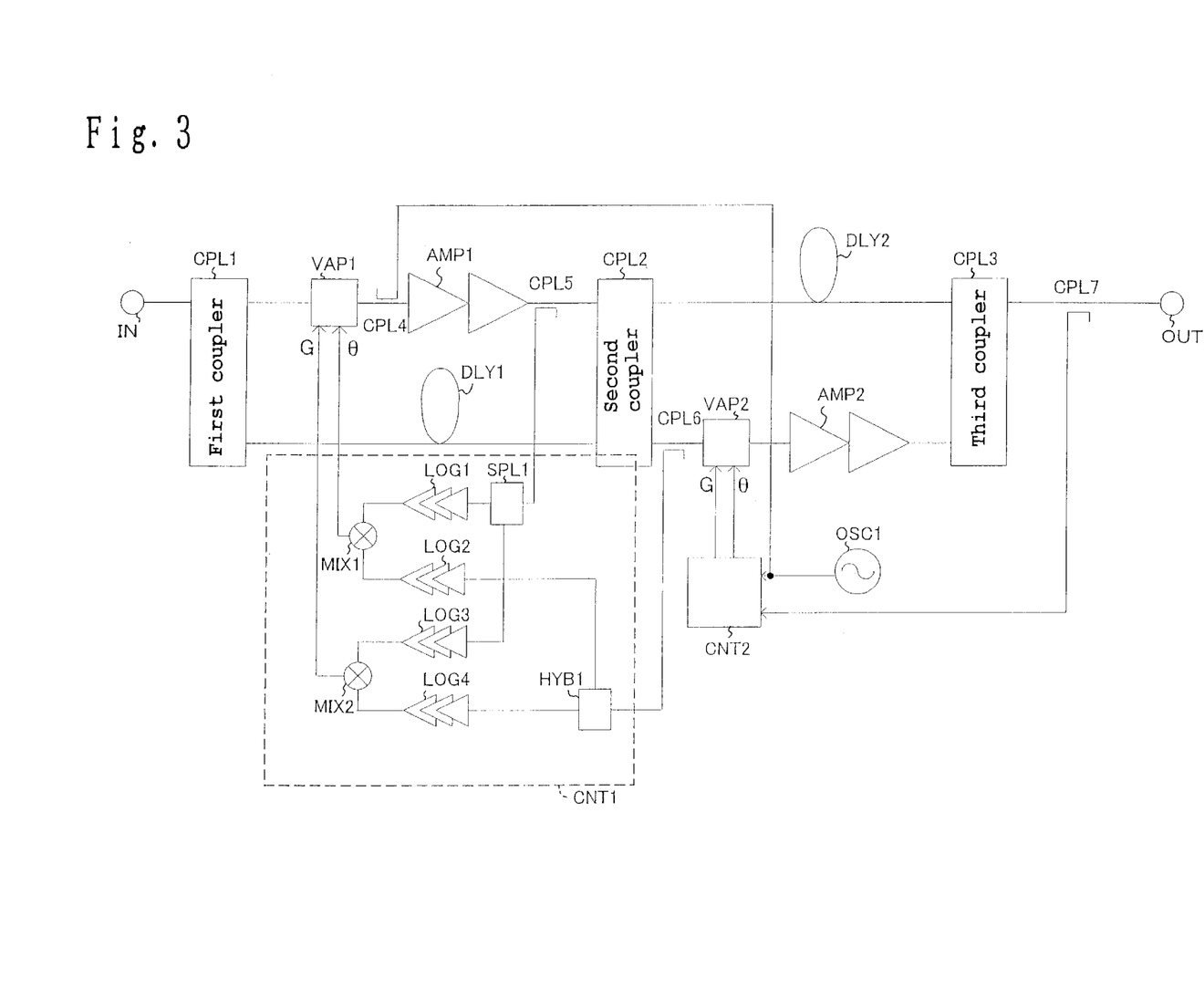
FIG. 3 is a block diagram of the feedforward amplifier of Embodiment 2 of the present invention.

The feedforward amplifier of Embodiment 2 has the same configuration as the aforementioned feedforward amplifier of Embodiment 1, where the portions in FIG. 1 duplicated in FIG. 3 mutually have the same signs and description thereof will be omitted. Moreover, LOG3 is a third log amplifier and LOG4 is a fourth log amplifier.

Although the feedforward amplifier of Embodiment 2 requires two log amplifiers of the third and fourth log amplifiers LOG3 and LOG4 as extra compared to the aforementioned feedforward amplifier of Embodiment 1, it does not require a switch such as SW1 (refer to FIG. 1) and control thereof is a little easier.

Next, the operation of the feedforward amplifier of Embodiment 2 will be described.

As with Embodiment 1, the distortion detection loop control CNT1 uses the transmitting carrier taken out of the fifth coupler CPL5 and the transmitting carrier suppressed by a distortion detection loop taken out of the sixth coupler CPL6.

The transmitting carrier taken out of the fifth coupler CPL5 is divided in the same phase by the in-phase power divider SPL1. The suppressed transmitting carrier taken out of the sixth coupler CPL6 is divided with a phase difference of 90 degrees by the 90-degree power divider HYB1.

As with Embodiment 1, one of the outputs of the in-phase power divider SPL1 is amplified by the first log amplifier LOG1, and one of the outputs of the 90-degree power divider HYB1 is amplified by the second log amplifier LOG2, and then the respective outputs are inputted to the first mixer MIX1 so as to obtain a phase error output.

In addition, the other output of the in-phase power divider SPL1 is amplified by the third log amplifier LOG3, and the other output of the 90-degree power divider HYB1 is amplified by the fourth log amplifier LOG4, and then the respective outputs are inputted to the second mixer so as to obtain the output proportional to 1−k of the first term of [Equation 6] and obtain the amplitude error output.

Thus, this embodiment uses the log amplifier and expands a working range of the mixer so as to allow distortion detection loop control to be performed at high speed via no logical circuit and without using an auto level control circuit which includes unstableness such as a temperature characteristic.

Moreover, this embodiment has the in-phase power divider SPL1 and the 90-degree power divider HYB1 placed on the input of the log amplifier. However, the same effect can be obtained, not only thereby, but by placing the in-phase power divider SPL1 and the 90-degree power divider HYB1 on the output of the log amplifier to share the first and third log amplifiers and share the second and fourth log amplifiers, and besides, the apparatus can thereby be rendered smaller since two log amplifiers can be reduced altogether.

In addition, it is obvious that while this embodiment uses the log amplifiers, the same effect can be obtained by using the limiter amplifiers to the extent that phase information is not lost.

In addition, Embodiments 1 and 2 have the fifth coupler CPL5 placed between the output of the main amplifier AMP1 and the input of the second coupler CPL2. However, the fifth coupler can be placed anywhere as far as the signal to be taken out includes the transmitting carrier which is a reference. For instance, the same effect can be obtained obviously by placing the fifth coupler CPL5 to take out the transmitting carrier from the following. (1) Between the output of the first delay element DLY1 and the input of the second coupler CPL2, (2) at the input of the first delay element DLY1, (3) between the stages or at the input thereof in the case where the main amplifier AMP1 is multistage, (4) between the output of the second coupler CPL2 and the input of the second delay element DLY2, (5) between the second delay elements DLY2 in the case where there are a plurality of them, (6) between the output of the second delay element DLY2 and the input of the third coupler CPL3, (7) behind the output of the third coupler CPL3, (8) at the combined output of the seventh coupler and so on.

Moreover, Embodiments 1 and 2 have the sixth coupler CPL6 placed between the output of the second coupler CPL2 and the input of the second vector adjuster via no other element. However, it is not limited to this, but the following are also feasible. (1) To insert the amplifier between the output of the second coupler CPL2 and the input of the sixth coupler CPL6 in order to increase the combined output level of the sixth coupler CPL6, (2) to insert an attenuator or both the attenuator and amplifier between the output of the second coupler CPL2 and the input of the sixth coupler CPL6 in order to curb reflected power from the sixth coupler CPL6 to the second coupler CPL2 and prevent a standing wave.

In addition, the same effect can be obtained by integrating in the same semiconductor substrate at least two of circuit elements constituting the distortion detection loop control circuit CNT1 shown in Embodiments 1 and 2 to render them as an IC, and besides, the apparatus can thereby be rendered smaller.

(Embodiment 3)

Next, the configuration of the feedforward amplifier of Embodiment 3 of the present invention will be described by referring to FIG. 4 which is a block diagram thereof.

Figure 4:
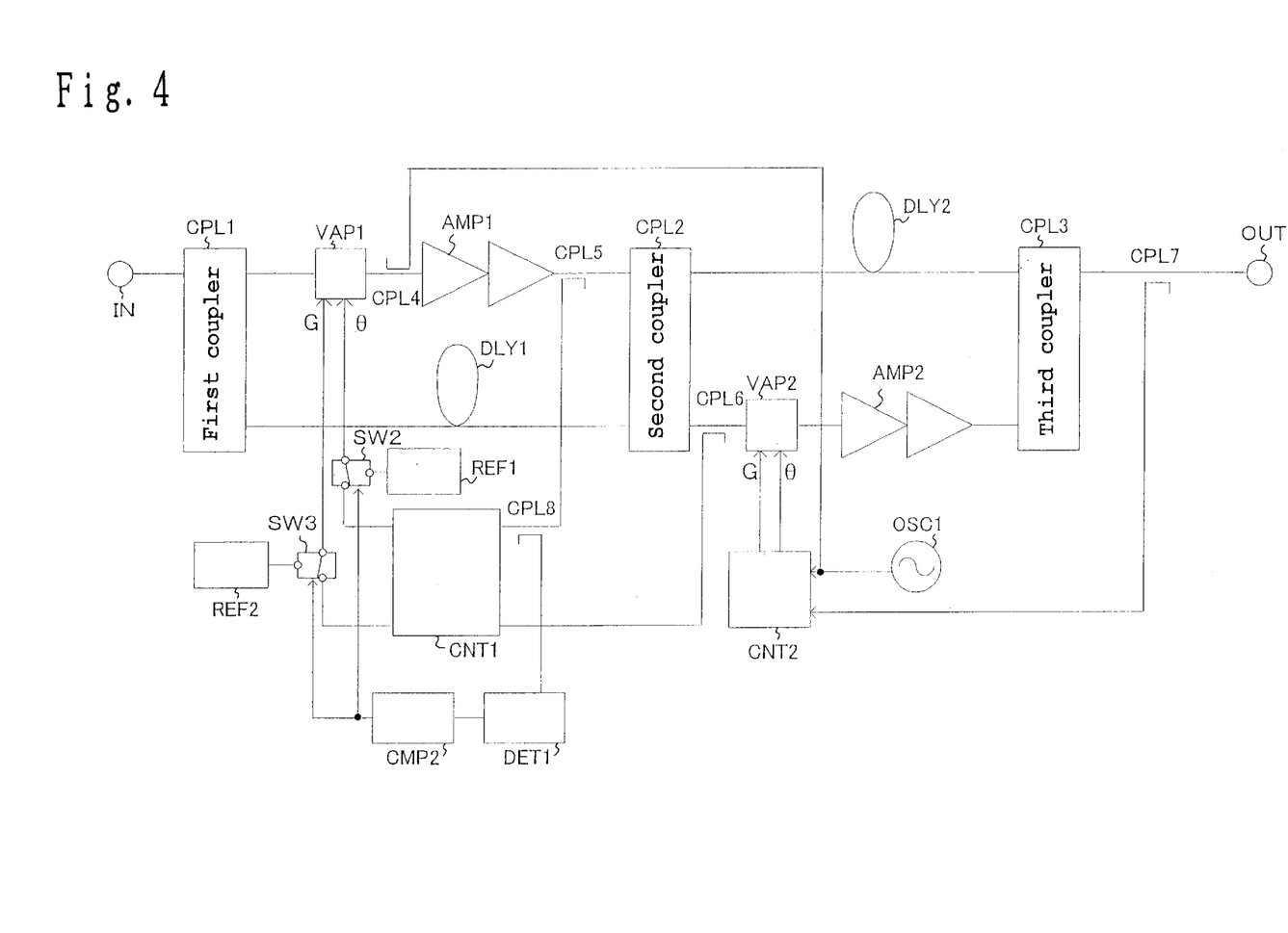
FIG. 4 is a block diagram of the feedforward amplifier of Embodiment 3 of the present invention.

The feedforward amplifier of this embodiment 3 has the same configuration as the aforementioned feedforward amplifiers of Embodiments 1 and 2, where the portions in FIG. 1 or FIG. 3 duplicated in FIG. 4 mutually have the same signs and description thereof will be omitted. Moreover, reference character CPL8 represents an eighth coupler, DET1 represents a power detection circuit, CMP2 represents a second comparator, REF1 represents a first reference voltage generation circuit, REF2 represents a second reference voltage generation circuit, SW2 represents a second switching circuit, and SW3 represents a third switching circuit. In addition, the distortion detection loop control circuit CNT1 is the circuit described in Embodiments 1 and 2.

Next, operation of the feedforward amplifier in Embodiment 3 of the present invention will be described.

In the case where the output power is reduced, the distortion generated in the main amplifier AMP1 becomes very small.

Thus, the power of the transmitting carrier combined and taken out of the eighth coupler CPL8 is detected by the power detection circuit DET1, and a fixed phase control voltage is generated on the first reference voltage generation circuit REF1 and a fixed amplitude control voltage is generated on the second reference voltage generation circuit REF2. And in the case where sufficient low distortion characteristic can be obtained without performing adaptive feedforward distortion compensation, an adaptive control voltage generated on the distortion detection loop control circuit CNT1 is switched to the fixed phase control voltage or amplitude control voltage on the second and third switching circuits SW2 and SW3 via the second comparator CMP2 according to the size of a detection voltage detected on the power detection circuit DET1.

Thus, it becomes possible to perform the distortion detection loop control at high speed via no logical circuit and without using the auto level control circuit including unstableness such as the temperature characteristic, and besides, it also becomes possible on low output to reduce power consumption by switching the distortion detection loop control circuit CNT1 to the fixed voltage and turning off the powder.

In addition, it is also possible to reutilize the output voltage of the power detection circuit DET1 as an output power monitor of the feedforward amplifier, and the same effect will not be impaired in this case.

The embodiments 1 to 3 were described in detail above.

In short, the present invention is the feedforward amplifier comprising: input carrier signal dividing means (CPL1) of dividing an input carrier signal into two output signals; adjusting means (VAP1) of adjusting one of the two divided output signals; amplifying means (AMP1) of amplifying the adjusted one of the output signals to generate an amplification signal; distortion signal extracting means (CPL2) of extracting a distortion signal by utilizing the other output signal of the two divided output signals and the generated amplification signal; output signal generating means (CPL3) of generating the output carrier signal by utilizing the generated amplification signal and the extracted distortion signal; and control means (CNT1) having at least one log amplifier of controlling the adjusting means based on the other output signal and the generated amplification signal.

As a matter of course, it may have delaying means (DLY1) of delaying the other output signal, wherein the log amplifier is utilized to control the adjusting means by (1) detecting the phase error as a deviation from an opposite phase of a difference between the phase of the delayed other output signal and the phase of the generated amplification signal, and (2) detecting the amplitude error as a deviation between the amplitude of the delayed other output signal and the amplitude of the generated amplification signal, so that the detected phase error and the detected amplitude error become zero.

Thus, according to the present invention, the phase error voltage is acquired by mixing the carrier signal amplified by the log amplifier, an absolute value of the amplitude error voltage is acquired by a subtractor, and the signal of which phase is displaced by 90 degrees is mixed to determine the sign of the amplitude error and switch it by adapting the sign of the amplitude error voltage, so that it is possible to perform high-speed distortion compensation control without using the auto level control circuit which is unstable due to the temperature characteristic and so on.

In addition, it is also possible, when the output power is low, to switch adaptive distortion detection loop control to fixed control and stop the operation of the distortion detection loop control circuit so as to reduce the current consumption.

The entire disclosure of the above-mentioned literature is incorporated herein by reference in its entirety.

As is obvious from the above description, the present invention has an advantage that the high-speed distortion compensation control can be performed without using the auto level control circuit.

What is claimed is:

1. A feedforward amplifier comprising:

a first coupler of dividing an input signal into two outputs;

a first vector adjuster connected to one of the outputs of said first coupler, of adjusting an amplitude and a phase of a passing signal;

a main amplifier connected to the output of said first vector adjuster;

a first delay element connected to the other output of said first coupler;

a second coupler connected to the output of said main amplifier and the output of said first delay element, of outputting the output of said main amplifier as it is as a first output and outputting as a second output a component in which the output of said main amplifier and the output of said first delay element are combined in an opposite phase;

a second delay element connected to the first output of said second coupler;

a second vector adjuster connected to the second output of said second coupler, of adjusting the amplitude and the phase of the passing signal;

an error amplifier connected to the output of said second vector adjuster;

a third coupler connected to the output of said second delay element and the output of said error amplifier, of outputting a component in which the output of said second delay element and the output of said error amplifier are combined in the opposite phase;

a fourth coupler inserted into at least one location between the output of said first vector adjuster and the output of said main amplifier;

a fifth coupler inserted between the output of said main amplifier and said second coupler;

a sixth coupler inserted between the second output of said second coupler and the input of said second vector adjuster;

a seventh coupler connected to the output of said third coupler;

a distortion cancellation loop control circuit of dividing in two the output of at least one predetermined local oscillator, connecting one of the outputs to a combined input of said fourth coupler, inputting the other output and a combined output of said seventh coupler, and comparing an output signal of said at least one local oscillator to a combined output signal of said seventh coupler to acquire an error in the amplitude and an error in the phase so as to provide a control voltage to two control terminals of said second vector adjuster;

an in-phase power dividing circuit connected to the combined output of said fifth coupler;

a 90-degree power dividing circuit connected to the combined output of said sixth coupler;

a first log amplifier connected to one of the outputs of said in-phase power dividing circuit;

a second log amplifier connected to one of the outputs of said 90-degree power dividing circuit;

a first mixer connected to the output of said first log amplifier and the output of said second log amplifier;

a subtraction circuit connected to the output of said first log amplifier and the output of said second log amplifier;

an inversion circuit connected to the output of said subtraction circuit;

a switching circuit of having the output of said subtraction circuit and the output of said inversion circuit inputted therein and outputting one of them;

a second mixer connected to the other output of said in-phase power dividing circuit and the other output of said 90-degree power dividing circuit; and a comparator connected to the output of said second mixer, and wherein:

the two outputs of said distortion cancellation loop control circuit are connected to the two control terminals of said second vector adjuster;

the output of said comparator is connected to a switching control terminal of said switching circuit;

the output of said first mixer and the output of said switching circuit are connected to the two control terminals of said first vector adjuster directly or via at least one predetermined level changing means; and (1) as for the output of said second mixer, inversion and non-inversion of the output of said subtraction circuit are switched by using said switching circuit to be rendered as the error in said amplitude according to a phase comparison output between a combined output signal of said fifth coupler and a combined output signal of said sixth coupler and an output result of said comparator; and (2) the output of said first mixer is rendered as the error in said phase, and the control voltage is provided to the two control terminals of said first vector adjuster based on the error in the amplitude and the error in the phase.

2. The feedforward amplifier according to claim 1, wherein said in-phase power dividing circuit is connected to the output of said first log amplifier and said 90-degree power dividing circuit is connected to the output of said second log amplifier.

3. A feedforward amplifier comprising:

a first coupler of dividing an input signal into two outputs;

a first vector adjuster connected to one of the outputs of said first coupler, of adjusting an amplitude and a phase of a passing signal;

a main amplifier connected to the output of said first vector adjuster;

a first delay element connected to the other output of said first coupler;

a second coupler connected to the output of said main amplifier and the output of said first delay element, of outputting the output of said main amplifier as it is as a first output and outputting as a second output a component in which the output of said main amplifier and the output of said first delay element are combined in an opposite phase;

a second delay element connected to the first output of said second coupler;

a second vector adjuster connected to the second output of said second coupler, of adjusting the amplitude and the phase of the passing signal;

an error amplifier connected to the output of said second vector adjuster;

a third coupler connected to the output of said second delay element and the output of said error amplifier, of outputting a component in which the output of said second delay element and the output of said error amplifier are combined in the opposite phase;

a fourth coupler inserted into at least one location between the output of said first vector adjuster and the output of said main amplifier;

a fifth coupler inserted between the output of said main amplifier and said second coupler;

a sixth coupler inserted between the second output of said second coupler and the input of said second vector adjuster;

a seventh coupler connected to the output of said third coupler;

a distortion cancellation loop control circuit of dividing in two the output of at least one predetermined local oscillator, connecting one of the outputs to a combined input of said fourth coupler, inputting the other output and a combined output of said seventh coupler, and comparing an output signal of said at least one local oscillator to a combined output signal of said seventh coupler to acquire an error in the amplitude and an error in the phase so as to provide a control voltage to two control terminals of said second vector adjuster;

an in-phase power dividing circuit connected to the combined output of said fifth coupler;

a 90-degree power dividing circuit connected to the combined output of said sixth coupler;

a first log amplifier connected to one of the outputs of said in-phase power dividing circuit;

a second log amplifier connected to one of the outputs of said 90-degree power dividing circuit;

a first mixer connected to the output of said first log amplifier and the output of said second log amplifier;

a third log amplifier connected to the other output of said in-phase power dividing circuit;

a fourth log amplifier connected to the other output of said 90-degree power dividing circuit; and a second mixer connected to the output of said third log amplifier and the output of said fourth log amplifier, and wherein:

the two outputs of said distortion cancellation loop control circuit are connected to the two control terminals of said second vector adjuster;

the output of said first mixer and the output of said second mixer are connected to the two control terminals of said first vector adjuster directly or via at least one predetermined level changing means; and (1) the output of said first mixer is rendered as the error in said phase; and (2) the output of said second mixer is rendered as the error in said amplitude, and the control voltage is provided to the two control terminals of said first vector adjuster based on the error in the amplitude and the error in the phase.

4. The feedforward amplifier according to claim 3, wherein said in-phase power dividing circuit is connected to the output of said first log amplifier and said 90-degree power dividing circuit is connected to the output of said second log amplifier;

said first mixer is connected to one of the outputs of said in-phase power dividing circuit and one of the outputs of said 90-degree power dividing circuit;

said second mixer is connected to the other output of said in-phase power dividing circuit and the other output of said 90-degree power dividing circuit; and said third and fourth log amplifiers are omitted.

5. The feedforward amplifier according to any of claims 1 to 4, wherein said fifth coupler is inserted between the output of said first delay and said second coupler or between the output of said first coupler and the input of said first delay element.

6. The feedforward amplifier according to any of claims 1 to 4, wherein said fifth coupler is inserted at the inputs of said main amplifier the stages of said main amplifier.

7. The feedforward amplifier according to any of claims 1 to 4, wherein said fifth coupler is inserted (1) between the output of said second coupler and the input of said second delay element, (2) between the stages of said second delay element, or (3) between the output of said second delay element and the input of said third coupler.

8. The feedforward amplifier according to any of claims 1 to 4, wherein said fifth coupler is inserted behind the output of said third coupler or between the combined output of said seventh coupler and the input of said distortion cancellation loop control circuit.

9. The feedforward amplifier according to claim 1, wherein at least one amplifiers or attenuator is inserted between the second output of said second coupler and the input of said sixth coupler.

10. The feedforward amplifier according to claim 3 or 4, wherein said first to fourth log amplifiers are limiter amplifiers.

11. The feedforward amplifier according to claim 3 or 4, wherein at least two of said first to fourth log amplifiers, said first and second mixers, said subtraction circuit, said comparator, said inversion circuit, said switching circuit, said in-phase power dividing circuit and said 90-degree power dividing circuit are integrated in the same semiconductor substrate.

12. The feedforward amplifier according to claim 1, comprising:

a distortion detection loop control circuit of inputting the combined output of said fifth coupler and the combined output of said sixth coupler, and outputting the control voltage to a phase control terminal and an amplitude control terminal of said first vector adjuster respectively;

an eighth coupler inserted between the combined output of said fifth coupler and one of the inputs of said distortion detection loop control circuit;

a power detection circuit connected to the combined output of said eighth coupler;

a second comparator connected to a detection output of said power detection circuit;

a second switching circuit of connecting a common terminal to the phase control terminal of said first vector adjuster and connecting to a switching terminal one of the outputs of said distortion detection loop control circuit and the output of a first reference voltage generation circuit of generating a first reference voltage;

a third switching circuit of connecting the common terminal to the amplitude control terminal of said first vector adjuster and connecting to the switching terminal the other output of said distortion detection loop control circuit and the output of a second reference voltage generation circuit of generating a second reference voltage, wherein:

according to the output of said second comparator, said second switching circuit switches between one of the outputs of said distortion detection loop control circuit and the output of said first reference voltage generation circuit; and said third switching circuit switches between the other output of said distortion detection loop control circuit and the output of said second reference voltage generation circuit.

13. The feedforward amplifier according to claim 12, wherein the output of said power detection circuit is utilized as an output power monitor.

14. A feedforward amplifier comprising:

input carrier signal dividing means of dividing an input carrier signal into two output signals;

adjusting means of adjusting one of said two divided output signals;

amplifying means of amplifying said adjusted one of the output signals to generate an amplification signal;

distortion signal extracting means of extracting a distortion signal by utilizing the other output signal of said two divided output signals and said generated amplification signal;

output signal generating means of generating an output carrier signal by utilizing said generated amplification signal and said extracted distortion signal; and control means having at least one log amplifier of controlling said adjusting means based on said other output signal and said generated amplification signal, said control means including a 90-degree lower dividing circuit and a log amplifier connected to an output of the 90-degree lower dividing circuit, said distortion signal extracting means being coupled to said 90-degree power dividing circuit.

15. A feedforward amplifier comprising:

input carrier signal dividing means of dividing an input carrier signal into two output signals;

adjusting means of adjusting one of said two divided output signals;

delaying means of delaying said other output signal;

amplifying means of amplifying said adjusted one of the output signals to generate an amplification signal:

distortion signal extracting means of extracting a distortion signal by utilizing the other output signal of said two divided output signals and said generated amplification signal;

output signal generating means of generating an output carrier signal by utilizing said generated amplification signal and said extracted distortion signal; and control means having at least one log amplifier of controlling said adjusting means based on said other output signal and said generated amplification signal, wherein said log amplifier is utilized to control said adjusting means by (1) detecting a phase error as a deviation from an opposite phase of a difference between the phase of said delayed other output signal and the phase of said generated amplification signal, and (2) detecting an amplitude error as a deviation between the amplitude of said delayed other output signal and the amplitude of said generated amplification signal, so that said detected phase error and said detected amplitude error become zero.

16. A feedforward amplifying method comprising:

an input carrier signal dividing step of dividing an input carrier signal into two output signals;

an adjusting step of adjusting one of said two divided output signals;

an amplifying step of amplifying said adjusted one of the output signals to generate an amplification signal;

a distortion signal extracting step of extracting a distortion signal by utilizing the other output signal of said two divided output signals and said generated amplification signal;

an output signal generating step of utilizing said generated amplification signal and said extracted distortion signal to generate an output carrier signal;

a control step of controlling said adjusting by utilizing a log amplifier based on said other output signal and said generated amplification signal;

a delaying step of delaying said other output signal; and controlling said adjusting step utilizing said log amplifier by (1) detecting a phase error as a deviation from an opposite phase of a difference between the phase of said delayed other output signal and the phase of said generated amplification signal, and (2) detecting an amplitude error as a deviation between the amplitude of said delayed other output signal and the amplitude of said generated amplification signal, so that said detected phase error and said detected amplitude error become zero.

* * * * *

UNITED STATES PATENT AND TRADEMARK OFFICE
CERTIFICATE OF CORRECTION

PATENT NO.   : 6,791,409 B2
DATED        : September 14, 2004
INVENTOR(S)  : Kaoru Ishida et al.

It is certified that error appears in the above-identified patent and that said Letters Patent is hereby corrected as shown below:

Column 16,
Line 48, between "amplifier" and "the", insert -- or between --.
Line 61, "amplifiers" should read -- amplifier --.

Column 18,
Lines 2 and 4, "lower" should read -- power --.

Signed and Sealed this

Twenty-ninth Day of March, 2005

JON W. DUDAS
*Director of the United States Patent and Trademark Office*